United States Patent
Yakushiji et al.

(10) Patent No.: US 10,149,385 B2
(45) Date of Patent: Dec. 4, 2018

(54) AFFIXING STRUCTURE FOR ELECTRONIC COMPONENT

(71) Applicant: MITSUBISHI HEAVY INDUSTRIES AUTOMOTIVE THERMAL SYSTEMS, LTD., Tokyo (JP)

(72) Inventors: Shunsuke Yakushiji, Tokyo (JP); Hitoshi Tamaki, Tokyo (JP); Takayuki Takashige, Kiyosu (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 0 days.

(21) Appl. No.: 15/031,383

(22) PCT Filed: Dec. 10, 2014

(86) PCT No.: PCT/JP2014/006153
§ 371 (c)(1),
(2) Date: Apr. 22, 2016

(87) PCT Pub. No.: WO2015/087546
PCT Pub. Date: Jun. 18, 2015

(65) Prior Publication Data
US 2016/0278212 A1    Sep. 22, 2016

(30) Foreign Application Priority Data
Dec. 13, 2013  (JP) .................. 2013-258167

(51) Int. Cl.
| | | |
|---|---|---|
| H01R 41/00 | (2006.01) |
| H05K 1/18 | (2006.01) |
| F04B 35/04 | (2006.01) |
| F04B 39/12 | (2006.01) |
| H05K 3/30 | (2006.01) |
| F04C 18/02 | (2006.01) |
| H02K 11/00 | (2016.01) |
| H05K 3/34 | (2006.01) |
| F04C 23/00 | (2006.01) |

(52) U.S. Cl.
CPC ............... H05K 1/18 (2013.01); F04B 35/04 (2013.01); F04B 39/121 (2013.01);
(Continued)

(58) Field of Classification Search
CPC ............. H05K 1/18; H05K 2201/2009; H05K 2201/1003; H05K 2201/2045;
(Continued)

(56) References Cited

U.S. PATENT DOCUMENTS

2003/0054677 A1*  3/2003  Lee ..................... H01R 12/725
                                                              439/79
2008/0000675 A1   1/2008  Arroyave et al.
(Continued)

FOREIGN PATENT DOCUMENTS

JP    62-28446 U    2/1987
JP    3-102762 U   10/1991
(Continued)

OTHER PUBLICATIONS

International Search Report, issued in PCT/JP2014/006153, dated Mar. 3, 2015.

*Primary Examiner* — Jean F Duverne
(74) *Attorney, Agent, or Firm* — Birch, Stewart, Kolasch & Birch, LLP

(57) ABSTRACT

An affixing structure that reduces costs and reduces the risk of vibration causing damage or the like to electrical connection terminals on an electronic component affixed to a circuit board is provided. In the affixing structure, which is affixed to a circuit board (21) via a plurality of lead frames (55) that are part of a transformer (50), at least one second
(Continued)

side wall perpendicular to a first side wall where the lead frames (55) are arranged is adhesively supported on the circuit board (21) by a support (60). The height (H3) of the part of the support (60) in contact with the transformer (50) is greater than or equal to the height (H2) of the center of gravity of the electronic component, and the length (L) of the support (60) in the direction of the first side wall is greater than or equal to the height (H3).

11 Claims, 4 Drawing Sheets

(52) U.S. Cl.
CPC .......... *F04C 18/0215* (2013.01); *H02K 11/00* (2013.01); *H05K 3/305* (2013.01); *F04C 23/008* (2013.01); *F04C 2240/803* (2013.01); *F04C 2240/808* (2013.01); *H05K 3/3421* (2013.01); *H05K 2201/1003* (2013.01); *H05K 2201/2009* (2013.01); *H05K 2201/2045* (2013.01); *Y02P 70/613* (2015.11)

(58) Field of Classification Search
CPC ...... H05K 3/3421; H05K 3/305; H02K 11/00; F04C 18/0215; F04C 23/008; F04C 2240/803; F04C 2240/808; Y02P 70/613; F04B 39/121; F04B 35/04; H01R 12/707
USPC .......................................................... 439/32
See application file for complete search history.

(56) References Cited

U.S. PATENT DOCUMENTS

| | | | |
|---|---|---|---|
| 2009/0011623 A1* | 1/2009 | Hisamatsu | H01R 12/707 439/79 |
| 2010/0284838 A1 | 11/2010 | Ichise et al. | |
| 2011/0175237 A1* | 7/2011 | Tomura | H01L 21/563 257/778 |
| 2011/0236235 A1 | 9/2011 | Hattori et al. | |
| 2012/0080219 A1* | 4/2012 | Takeuchi | H01L 21/4846 174/259 |
| 2013/0069494 A1 | 3/2013 | Hattori et al. | |
| 2015/0173245 A1* | 6/2015 | Chung | H04M 1/0277 361/714 |
| 2015/0181740 A1 | 6/2015 | Tokii et al. | |

FOREIGN PATENT DOCUMENTS

| | | |
|---|---|---|
| JP | 4-28472 U | 3/1992 |
| JP | 5-73913 U | 10/1993 |
| JP | 9-135060 A | 5/1997 |
| JP | 11-204352 A | 7/1999 |
| JP | 2002-270990 A | 9/2002 |
| JP | 2007-315269 A | 12/2007 |
| JP | 2012-87630 A | 5/2012 |
| WO | WO 2009/041461 A1 | 4/2009 |
| WO | WO 2010/101068 A1 | 9/2010 |
| WO | WO 2014/037978 A1 | 3/2014 |

\* cited by examiner

AFFIXING STRUCTURE FOR ELECTRONIC COMPONENT

TECHNICAL FIELD

The present invention relates to affixing structures, and particularly relates to an affixing structure for an electronic component such as a transformer.

BACKGROUND ART

An electric compressor used in a vehicle air conditioner includes a circuit assembly that bears circuits for controlling the driving of a motor. The circuit assembly includes a circuit board to which various circuit components are connected. The circuit board is affected by engine vibrations, road surface vibrations, and the like, and is therefore subjected to a harsh vibration environment.

When vibrations from the periphery of the circuit board cause the circuit board to vibrate, a heavy load is placed on large-size and high-mass electronic components affixed to the circuit board, such as a transformer. Transformers are affixed by soldering the distal ends of lead frames that constitute the transformer to the circuit board.

However, in harsh vibration environments, there is a risk that the lead frames will be damaged, cracks will appear in the soldered portion, or the like, causing the transformer to separate from the circuit board.

Accordingly, a technique that reduces vibrations transmitted to a circuit board by filling a space that contains the circuit board with a resin-based gel material has been proposed (Patent Documents 1 and 2).

CITATION LIST

Patent Literature

Patent Document 1: Japanese Unexamined Patent Application Publication No. 2007-315269A
Patent Document 2: Japanese Unexamined Patent Application Publication No. 2012-087630A

SUMMARY OF INVENTION

Technical Problem

In Patent Document 1 and Patent Document 2, the entire space that contains the circuit board is filled with the resin-based gel. Areas where electronic components are not provided are therefore also filled with the resin-based gel, which is wasteful. The resin-based gel used for the filling is expensive, and thus what is needed is a technique that reduces vibrations in a circuit board while reducing costs.

Accordingly, an object of the present invention is to provide an affixing structure that can reduce costs and makes it possible to lower the risk of vibrations causing damage or the like to electrical connection terminals of an electronic component affixed to a circuit board.

Solution to Problem

In light of the foregoing object, an affixing structure according to the present invention is an affixing structure affixed to a circuit board via a plurality of electrical connection terminals included in an electronic component. In such an affixing structure, at least one second side wall of the electronic component that is perpendicular to a first side wall where the electrical connection terminals are arranged is adhesively supported on the circuit board by a support, a height H3 of a part of the support in contact with the second side wall of the electronic component is greater than or equal to a height H2 from the circuit board to a position of the center of gravity of the electronic component, and a length L of the support in a direction following the first side wall is greater than or equal to the height H3.

By providing the support on the second side wall that is perpendicular to the first side wall where the electrical connection terminals are arranged, the support supports the electronic component, and thus damage to the electrical connection terminals and the like can be prevented. In addition, setting the height H3 of the support to be greater than or equal to the height H2 enables the support to receive vibrations from the center of gravity. Furthermore, setting the length L of the support in the direction that follows the first side wall to be greater than or equal to the height H3 makes it possible for the support to counteract stress from the electronic component and increase the rigidity of support for the electronic component.

In addition, the second side wall of the electronic component is adhesively supported on the circuit board by the support, which makes it possible to reduce costs.

The affixing structure according to the present invention can be applied to an electronic component in which each of the electrical connection terminals is constituted by a lead frame.

In the affixing structure according to the present invention, the support constituted only by an adhesive can be used.

The use of the support constituted only by an adhesive makes it possible to efficiently reduce vibrations in the electronic component, due to the elasticity of the support.

In addition, in the affixing structure according to the present invention, the support constituted by an adhesive and a stiffener affixed to the circuit board by the adhesive can be used.

By providing the support with a stiffener, the rigidity of support of the electronic component can be improved further.

Advantageous Effects of Invention

According to the present invention, an affixing structure for an electronic component that reduces costs and can prevent damage, cracking, or the like in an electrical connection terminal from vibrations can be provided.

BRIEF DESCRIPTION OF DRAWING

FIG. 3A is a top view of the affixing structure for a transformer, and FIG. 3B is a side view of the affixing structure for a transformer.

FIG. 4A is a top view of the affixing structure for a transformer, and FIG. 4B is a side view of the affixing structure for a transformer.

DESCRIPTION OF EMBODIMENTS

Embodiments of the present invention will be described hereinafter with reference to the appended drawings.

First Embodiment

Figure 1:
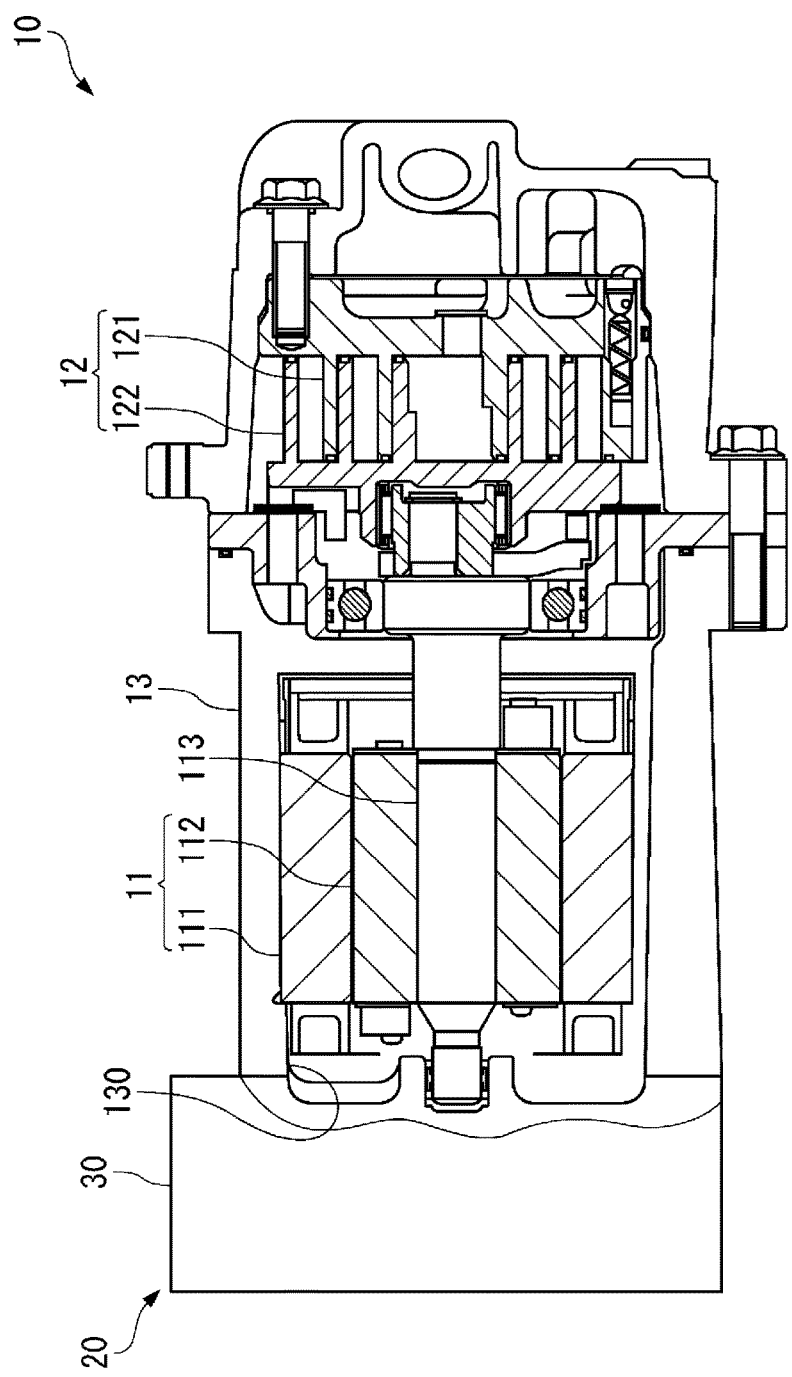
FIG. 1 is a longitudinal cross-sectional view of an electric compressor.

An electric compressor 10 illustrated in FIG. 1 is employed in a vehicle-mounted air conditioner. The electric compressor 10 includes a motor 11, a compression mechanism 12, a housing 13 that contains the motor 11 and the compression mechanism 12, and a circuit portion 20 that controls the driving of the motor 11.

The circuit portion 20 includes a circuit board 21 (FIG. 2) as one of the constituent elements, and circuit elements such as a switching element for generating drive signals to be supplied to the motor 11 and an IC chip for controlling the driving of the motor 11.

The motor 11 includes a stator 111 affixed to the housing 13 and a rotor 112 that rotates relative to the stator 111. The rotor 112 is rotated by three-phase alternating current supplied to the stator 111 by the circuit portion 20.

The compression mechanism 12 includes a fixed scroll 121 affixed to the housing 13 and an orbit scroll 122 that revolves relative to the fixed scroll 121.

The orbit scroll 122 is linked eccentrically to a shaft 113 affixed to the rotor 112.

Figure 2:
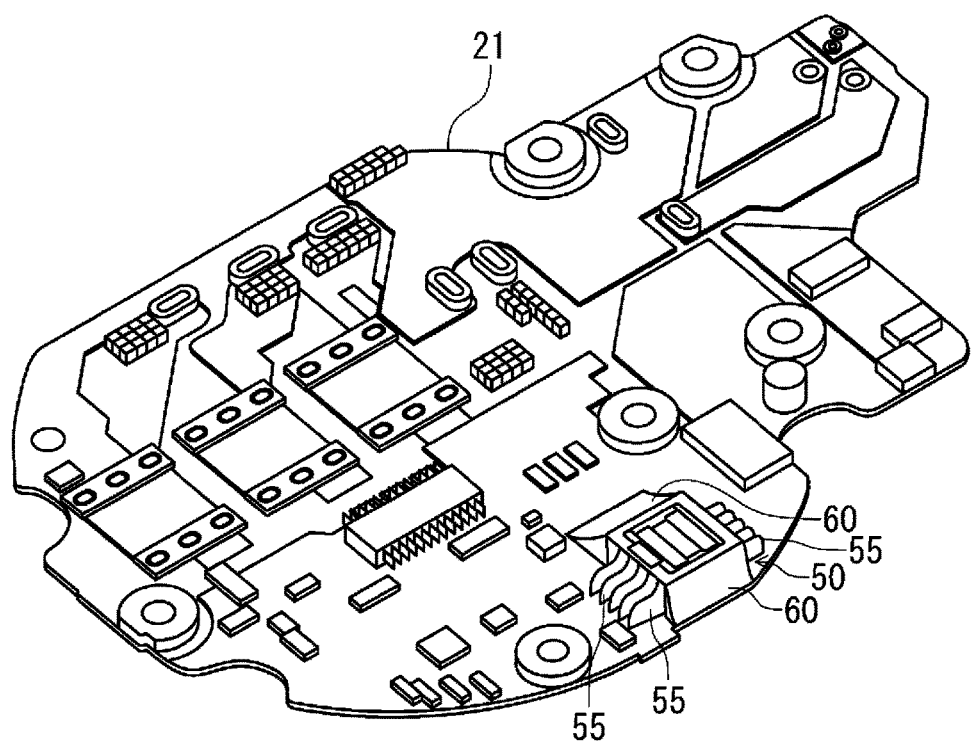
FIG. 2 is a perspective view of a circuit board according to a first embodiment.

The present embodiment has a characteristic of ensuring vibration resistance of large-size and high-mass electronic components that are affixed to the circuit board 21 illustrated in FIG. 2.

The present embodiment will describe a transformer (electronic component) 50 affixed to the circuit board 21 using a plurality of lead frames (electrical connection terminals) 55 as an example of a high-mass electronic component.

In arriving at the present invention, the inventors carried out vibration tests on the transformer 50 affixed to the circuit board 21. As a result, it was discovered that an eigenvalue for a direction X following first side walls (side walls 51a and 51c) of the transformer 50, on which the lead frames 55 are arranged, is lower than an eigenvalue for a direction Y following second side walls (side walls 51b and 51d) of the transformer 50, on which the lead frames 55 are not arranged. Resonance arises when the eigenvalue is low even in the case where the vibration occurs at a low frequency, placing a heavy load on the lead frames 55, the soldered areas, and the like.

Based on this result, it was thought that increasing the eigenvalue of the transformer 50 for vibrations in the direction X can reduce the risk of damage or the like to the lead frames 55, leading to the present invention.

Circuit Board 21

Circuit elements such as the transformer 50, which transforms a voltage (12 V, for example) supplied from a vehicle battery (not illustrated) into a low voltage for control (5 V, for example), a CPU that controls operations of the electric compressor 10, and an IC chip that controls the driving of the motor 11 are mounted on the circuit board 21. The circuit elements are provided on both front and back surfaces of the circuit board 21.

Transformer 50

Figure 3A:
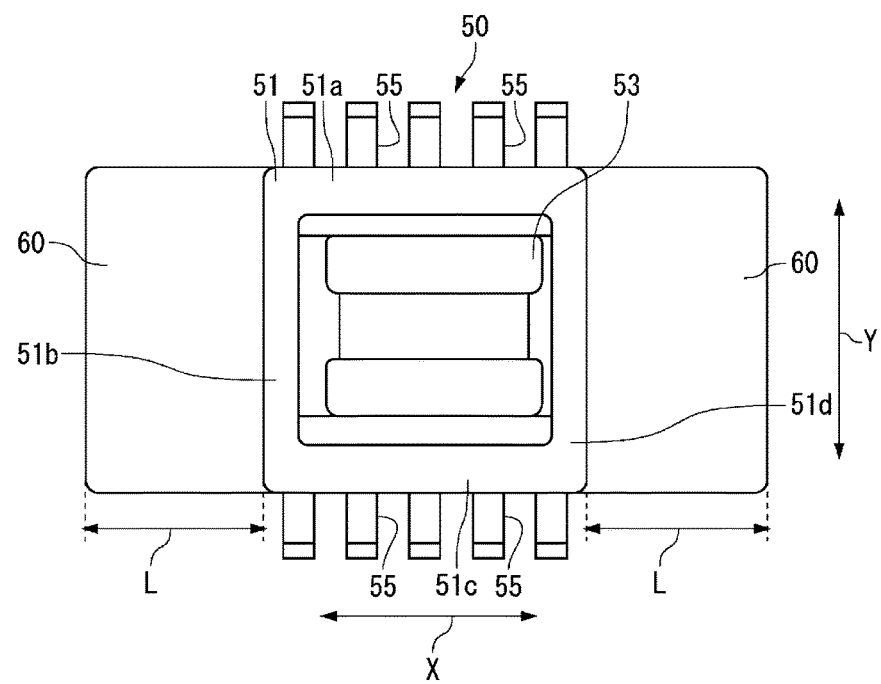
FIGS. 3A and 3B are diagrams illustrating an affixing structure for a transformer according to the first embodiment.
Figure 3B:
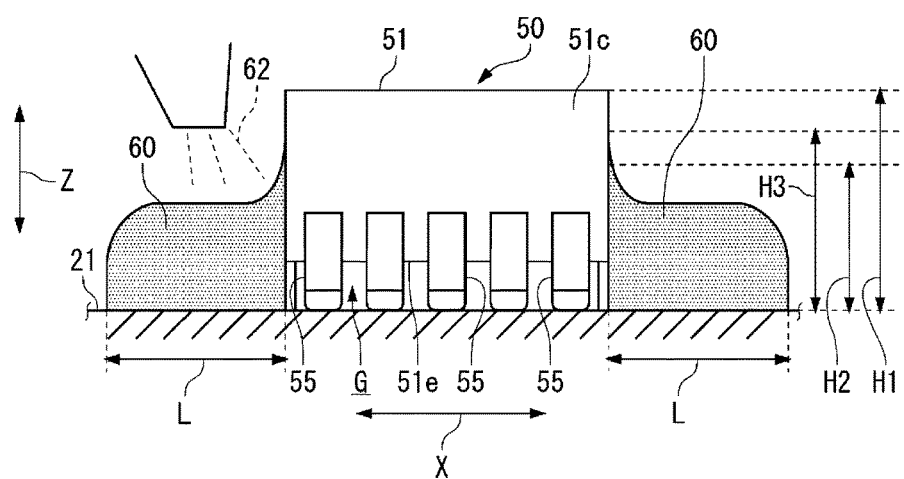

As illustrated in FIGS. 3A and 3B, the transformer 50 includes a housing 51, a coil 53 that transforms the voltage, and the lead frames 55.

The housing 51 includes the side walls 51a to 51d and a lower wall 51e, and has a box shape.

The side wall 51b and the side wall 51d are perpendicular to the side wall 51a and the side wall 51c.

The coil 53 is contained inside the housing 51.

The side wall 51a, and the side wall 51c that faces the side wall 51a, are each provided with the lead frames 55 that project in the direction Y from the bottom of the side walls.

A plurality of the lead frames 55 are arranged in the direction X. The lead frames 55 are electrically connected to corresponding circuit wires. The transformer 50 is affixed to the circuit board 21 by soldering the lead frames 55 to the circuit board 21.

At this time, the lead frames 55 can be separated into portions projecting from the side walls 51a and 51c in the direction Y, portions standing upright vertical relative to the circuit board 21, and portions affixed to the circuit board 21. The upright portions may be tilted relative to the circuit board 21.

Supports 60 are provided on the respective outer sides of the side wall 51b and the side wall 51d that faces the side wall 51b.

Note that a height of the transformer 50 is represented by H1 and a center of gravity height of the transformer 50 is represented by H2. The center of gravity height H2 of the transformer is calculated including the lead frames 55.

Supports 60

In the present embodiment, the supports 60 are formed by curing an adhesive 62.

The supports 60 are provided primarily to increase the rigidity of support of the transformer 50 in the direction X.

The adhesive 62 is provided across the entireties of the side wall 51b and the side wall 51d in the direction Y, and thus bonds the circuit board 21 to the side wall 51b and the circuit board 21 to the side wall 51d.

Meanwhile, the adhesive 62 is provided so that a height H3, in a height direction Z, of the supports 60 that are bonded to the side walls 51b and 51d is greater than or equal to the center of gravity height H2 of the transformer 50 from the circuit board 21 (H3≥H2).

Furthermore, the adhesive 62 is provided so that a length L of the supports 60 in the direction X is greater than or equal to the height H3 (L≥H3).

The side wall 51b and the side wall 51d are each affixed to the circuit board 21 upon the supports 60 being formed.

An adhesive for electronic components that is temperature resistant and electrically insulative is used as the adhesive 62. For example, a silicone adhesive for electronic components (Dow Corning® SE 738 White, produced by Dow Corning Toray Co., Ltd.) can be used as the adhesive 62. Note that the supports formed by curing the adhesive 62 have elasticity.

Effects

Next, effects of the supports 60 provided in the transformer 50 according to the present embodiment will be described.

The circuit board 21 incorporated into the vehicle-mounted electric compressor 10 is subjected to vibrations from the engine of the vehicle, vibrations from a drive power supply, vibrations from the electric compressor 10 itself, or the like, which causes the circuit board 21 and the electronic components to vibrate. Of the electronic components, a heavy load is placed on large-size and high-mass components such as the transformer 50, resulting in a risk of the lead frames 55 being damaged, cracks appearing in the soldered areas, or the like.

In the present embodiment, the side walls 51b and 51d, which are perpendicular to the side wall 51a and the side wall 51c at which the lead frames 55 are disposed, are supported by the supports 60 by being bonded to the circuit board 21 thereby.

When the transformer 50 is vibrated due to the aforementioned vibrations, the transformer 50 is restricted from vibrating in the direction X and the direction Y by the supports 60. Loads placed on the lead frames 55, the soldered areas, and the like can therefore be reduced.

Effect of H3≥H2

The supports 60 according to the present embodiment are provided so that the height H3 of the area connected to the side wall 51b (51d) is greater than or equal to the center of gravity height H2.

The transformer 50 vibrates in a mode in which the center of gravity thereof swings with the lead frames 55 acting as fulcrums. Accordingly, setting the height H3 of the supports 60 to be greater than or equal to the center of gravity height H2 of the transformer 50 enables the supports 60 to receive vibrations from the center of gravity.

Accordingly, setting the height H3 where the support 60 makes contact with the side wall 51b to be greater than or equal to the center of gravity height H2 makes it possible to reduce loads placed on the lead frames 55, the soldered areas, and the like.

Effect of L≥H3

The supports 60 according to the present embodiment are provided extending in the direction Y, so that the length L in the direction of support of the transformer 50 (the direction X) is greater than or equal to the height H3 of the area of the support 60 connected to the side wall 51b (51d).

A surface area that enables the supports 60 to counteract stress received from the transformer 50 due to vibrations is necessary between the supports 60 and the circuit board 21.

As such, setting the length L of the supports 60 to be greater than or equal to the height H3 makes it possible to counteract stress from the transformer 50 and increase the rigidity of support for the transformer 50.

The length L and the height H3 being equal is most preferable, as the supports 60 can counteract stress from the transformer 50 without using excess adhesive 62.

Furthermore, only an amount of the adhesive 62 needed to bond the circuit board 21 to the side wall 51b and the side wall 51d is necessary, which makes it possible to keep costs lower than in a case where a large amount of a resin-based gel material is used as per Patent Document 1 and Patent Document 2.

Second Embodiment

Next, a second embodiment of the present invention will be described.

The present embodiment differs from the first embodiment in that stiffeners 71 are provided in advance along the direction Y that follows the side walls 51b and 51d of the transformer 50.

The following descriptions will focus on the differences from the configuration described in the first embodiment.

Elements that are the same as those described in the first embodiment will be given the same reference numerals.

In the present embodiment, the stiffener 71 and the adhesive 62 constitutes a single support 74.

Figure 4A:
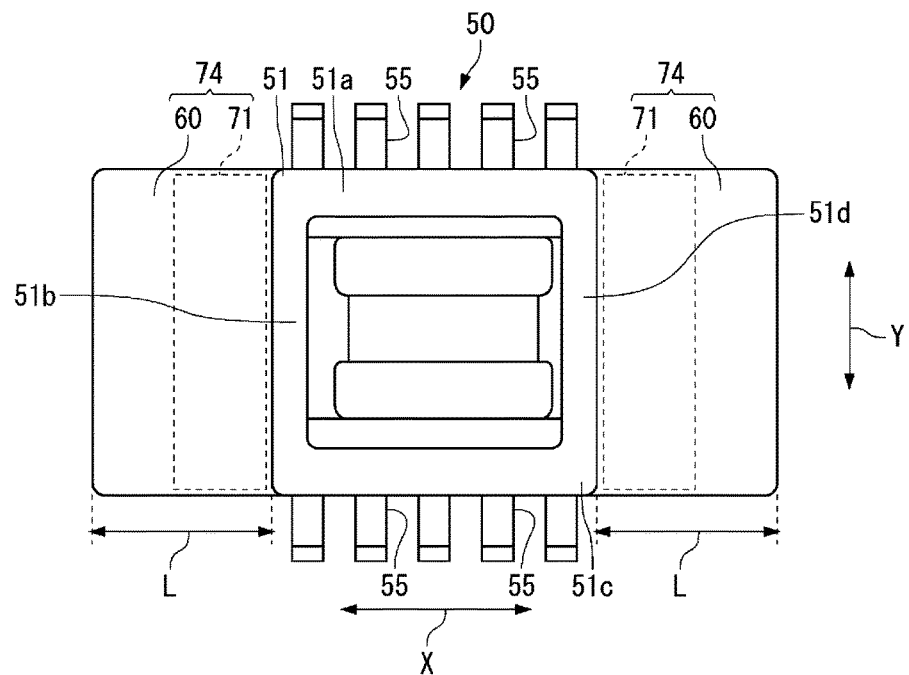
FIGS. 4A and 4B are diagrams illustrating an affixing structure for a transformer according to a second embodiment.
Figure 4B:
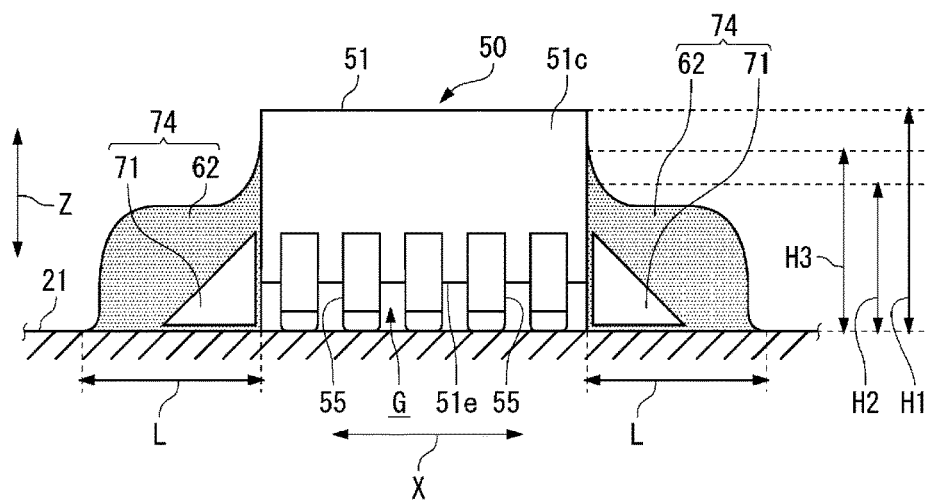

In the present embodiment, the stiffeners 71 are each disposed between the side walls 51b and 51d and the circuit board 21, and then the adhesive 62 is provided, as illustrated in FIGS. 4A and 4B.

The stiffeners 71 are triangular pillar-shaped members whose cross sections are right-angle triangles, and are members that are more rigid than the adhesive 62.

Each of the stiffeners 71 is affixed along the direction Y using the adhesive 62 so that one of the surfaces of the stiffener 71, the surfaces being perpendicular to each other, makes contact with the side wall 51b or the side wall 51d and the other surface makes contact with the circuit board 21. The supports 74 are formed by curing the adhesive 62.

The supports 74 are provided so that the height H3, in the height direction Z, of the bonding resin that makes contact with the side walls 51b and 51d is greater than or equal to the center of gravity height H2 of the transformer 50 (H3≥H2).

Furthermore, the supports 74 are provided so that a length L thereof in the direction X is greater than or equal to the height H3 (L≥H3).

Effects

According to the present embodiment, the transformer 50 is supported by the supports 74, which include the stiffeners 71 that are more rigid than the adhesive 62. As such, supporting the transformer 50 with the supports 74 makes it possible to increase the rigidity of support of the transformer 50 more than in the case where the transformer 50 is supported by the supports 60 formed only from the adhesive 62.

In addition, the supports 74 are provided so that the height H3 thereof in the height direction Z is greater than or equal to the center of gravity height H2 of the transformer 50 (H3≥H2), and furthermore so that the length L thereof in the direction X is greater than or equal to the height H3 (L≥H3), and thus loads on the lead frames 55, the soldered areas, and the like can be reduced in the same manner as in the first embodiment.

The stiffeners 71 according to the present embodiment are particularly useful in the case where a low-viscosity adhesive 62 is used.

In the case where a low-viscosity adhesive 62 is provided without providing the stiffeners 71, the adhesive 62 will enter into a gap G and harden while filling a space between the circuit board 21 and the lower wall 51e.

The hardened adhesive 62 will expand and contract in response to changes in ambient temperature, pushing up the lower wall 51e and exerting stress on the lead frames 55, the soldered areas, and the like.

Such stress will arise each time the temperature changes, fatiguing the lead frames 55, the soldered areas, and the like and causing damage, producing cracks, or the like.

In the present embodiment, providing the stiffeners 71 makes it possible to prevent the adhesive 62 from entering into the gap G. The supports 74 can therefore be formed while preventing the adhesive 62 from entering into the gap G even in the case when a low-viscosity adhesive 62 is used.

In addition, in the present embodiment as well, only an amount of the adhesive 62 needed to bond the circuit board 21 to the side wall 51b and the side wall 51d while meeting the condition of L≥H3≥H2 is necessary, and it is not necessary to use special members for the stiffeners 71. Costs can therefore be kept lower than a case where a large amount of resin-based gel material is used as per Patent Document 1 and Patent Document 2.

Although embodiments of the present invention have been described above, configurations described in the above embodiments can be selected as desired, or can be changed to other configurations as appropriate as long as there is no departure from the essential spirit of the present invention.

The present invention can be applied to an electronic component whose electrical connection terminals are connected to the circuit board 21 in an upright state.

In addition, although the supports 60 and 74 are provided on the respective sides of the side wall 51*b* and the side wall 51*d* in the above embodiments, loads placed on the lead frames 55, the soldered areas, and the like at times of vibration can be reduced even in the case where the support is provided only on one of the side walls.

Furthermore, although the foregoing describes an example in which the first side walls of the electronic component, on which the electrical connection terminals are arranged, are perpendicular to the second side walls of the electronic component, on which the electrical connection terminals are not arranged, it is of course possible to apply the present invention to an electronic component in which the first side walls and the second side walls are intersecting. In other words, an angle formed between the first side walls and the second side walls does not have to be 90 degrees.

REFERENCE SIGNS LIST

10 Electric compressor
11 Motor
12 Compression mechanism
13 Housing
20 Circuit portion
21 Circuit board
50 Transformer (electronic component)
51 Housing
51*a* to 51*d* Side wall
51*e* Lower wall
53 Coil
55 Lead frame (electrical connection terminal)
60 Support
62 Adhesive
71 Stiffener
74 Support
111 Stator
112 Rotor
113 Shaft
121 Fixed scroll
122 Orbit scroll
G Gap
X Direction
Y Direction
Z Height direction

The invention claimed is:

1. An affixing structure affixed to a circuit board via a plurality of electrical connection terminals included in an electronic component, wherein
   at least one second side wall of the electronic component that is perpendicular to a first side wall where the electrical connection terminals are arranged is adhesively supported on the circuit board by a support, with use of an adhesive having elasticity;
   a height (H3) of a part of the support in contact with the second side wall of the electronic component is greater than or equal to a height (H2) from the circuit board to a position of the center of gravity of the electronic component;
   a length (L) of the support in a direction following the first side wall is greater than or equal to the height (H3), and the electric component is a transformer.

2. The affixing structure according to claim 1, wherein each of the electrical connection terminals is constituted by a lead frame.

3. The affixing structure according to claim 1, wherein the support is constituted only by an adhesive.

4. The affixing structure according to claim 2, wherein the support is constituted only by an adhesive.

5. The affixing structure according to claim 1, wherein the support is constituted by an adhesive and a stiffener affixed to the circuit board by the adhesive.

6. The affixing structure according to claim 2, wherein the support is constituted by an adhesive and a stiffener affixed to the circuit board by the adhesive.

7. The affixing structure according to claim 5, wherein the stiffener is a triangular pillar-shaped member whose cross section is a right-angle triangle.

8. The affixing structure according to claim 1, wherein the electrical connection terminals are not arranged on the second side wall.

9. The affixing structure according to claim 1, wherein two of the second side walls are provided and supported by the respective supports.

10. The affixing structure according to claim 1, wherein the circuit board is incorporated into a vehicle electric compressor.

11. An affixing structure affixed to a circuit board via a plurality of electrical connection terminals included in an electronic component, wherein
    at least one second side wall of the electronic component that is perpendicular to a first side wall where the electrical connection terminals are arranged is adhesively supported on the circuit board by a support, with use of an adhesive having elasticity,
    a height (H3) of a part of the support in contact with the second side wall of the electronic component is greater than or equal to a height (H2) from the circuit board to a position of the center of gravity of the electronic component, and
    a length (L) of the support in a direction following the first side wall is greater than or equal to the height (H3).

* * * * *